(12) United States Patent
Weng

(10) Patent No.: US 7,973,690 B1
(45) Date of Patent: Jul. 5, 2011

(54) GAMMA VOLTAGE GENERATION CIRCUIT

(75) Inventor: Meng-Tse Weng, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/689,444

(22) Filed: Jan. 19, 2010

(51) Int. Cl.
*H03M 1/66* (2006.01)

(52) U.S. Cl. ........................................ 341/144; 341/154

(58) Field of Classification Search .................. 341/144, 341/138, 139, 122, 120; 345/87, 88, 89, 345/99

See application file for complete search history.

(56) References Cited

U.S. PATENT DOCUMENTS

| 7,307,610 | B2 * | 12/2007 | Sakaguchi | 345/89 |
| 7,724,171 | B2 * | 5/2010 | Lee et al. | 341/144 |
| 2009/0244109 | A1 * | 10/2009 | Chen et al. | 345/690 |

* cited by examiner

*Primary Examiner* — Brian Young
(74) *Attorney, Agent, or Firm* — J.C. Patents

(57) ABSTRACT

A gamma voltage generation circuit is provided. An offset voltage generator generates a first offset voltage by dividing a voltage difference between a first input voltage and a second input voltage based on a first code. A first voltage shifting circuit of a voltage level shifter shifts down a first reference voltage by the first offset voltage to output a first level-shifted voltage. A second voltage shifting circuit of the voltage level shifter shifts down a second reference voltage by the first offset voltage to output a second level-shifted voltage. Each of resistors of a resistor string outputs one of the gamma voltages. A first end and a second end of the resistor string are respectively coupled to a first output terminal and a second output terminal of the voltage level shifter.

15 Claims, 6 Drawing Sheets

GAMMA VOLTAGE GENERATION CIRCUIT

BACKGROUND OF THE INVENTION

1. Field of the Invention

The present invention relates to a gamma voltage generation circuit. More particularly, the present invention relates to a gamma voltage generation circuit capable of shifting gamma voltages by a common voltage level.

2. Description of Related Art

In a present information society, as information communication media and various electronic display devices are widely used in industrial apparatus or home appliances, the electronic display devices become indispensable, and the electronic display devices are continually updated to meet various demands of the information society.

Generally, the electronic display devices display and transmit various information to users. Namely, the electronic device can convert electronic information signals into optical information signals that can be visually recognized by the users.

In a present display device or a system, for example, a cathode-ray tube (CRT) or a liquid crystal display (LCD), a relationship between an input voltage and a display output thereof is not linear, and the relationship between the input voltage and the display output can be described by a gamma curve. Regarding the LCD, an output voltage (i.e. a gamma voltage) corresponding to each of gray levels can be found according to the gamma curve. A LCD panel can display a correct gray level according to the corresponding gamma voltage, so that the LCD can correctly display images.

To improve a display effect of the LCD, some of the LCD panels can divide a single pixel into two sub-pixels. Common voltage levels of the two sub-pixels are probably different due to a circuit structure design. In this case, when a same gamma voltage is output to the LCD panel, display effects of the two sub-pixels can be different, so that a display quality thereof is influenced. Referring to FIG. 1, a pixel is composed of two sub-pixels A and B. The common voltage level of the sub-pixel A is VCOMA, and the common voltage level of the sub-pixel B is VCOMB. A difference ΔV between the common voltage levels VCOMA and VCOMB causes a phenomenon of color shift of the LCD panel, such that the display quality of the LCD would be reduced.

SUMMARY OF THE INVENTION

The present invention is directed to a gamma voltage generation circuit, which can shift gamma voltages by a common voltage level.

The present invention provides a gamma voltage generation circuit configured to generate a plurality of gamma voltages. The gamma voltage generation circuit includes an offset voltage generator, a voltage level shifter, and a resistor string. The offset voltage generator generates a first offset voltage by dividing a voltage difference between a first input voltage and a second input voltage based on a first code. The voltage level shifter is coupled to the offset voltage generator, and includes a first voltage shifting circuit and a second voltage shifting circuit. The first voltage shifting circuit is coupled to the offset voltage generator, and shifts down a first reference voltage by the first offset voltage to output a first level-shifted voltage. The second voltage shifting circuit is coupled to the offset voltage generator, and shifts down a second reference voltage by the first offset voltage to output a second level-shifted voltage. The resistor string includes a plurality of resistors connected in series, and each of the resistors outputs one of the gamma voltages, wherein a first end of the resistor string is coupled to a first output terminal of the voltage level shifter, and a second end of the resistor string is coupled to a second output terminal of the voltage level shifter.

In an embodiment of the present invention, a voltage level of the first output terminal of the voltage level shifter is equal to the first level-shifted voltage, and a voltage level of the second output terminal of the voltage level shifter is equal to the second level-shifted voltage.

In an embodiment of the present invention, the offset voltage generator includes a digital-to-analog converter (DAC) and a first voltage divider. The DAC generates a first divided voltage by dividing the voltage difference between the first input voltage and the second input voltage according to the first code. The first voltage divider is coupled to the DAC, and divides the first divided voltage to generate the first offset voltage.

In an embodiment of the present invention, the first voltage divider includes a first resistor and a second resistor, wherein the first resistor and the second resistor are connected in series. A first end of the first resistor is applied with the first divided voltage, and a second end of the first resistor is coupled to the second resistor and outputs the first offset voltage.

In an embodiment of the present invention, the first voltage divider includes a first resistor, a second resistor, and an operational amplifier. The first resistor and the second resistor are connected in series. A first end of the first resistor is applied with the first divided voltage, and a second end of the first resistor is coupled to the second resistor and a positive input terminal of the operational amplifier. An output terminal of the operational amplifier is coupled to a negative input terminal of the operational amplifier and outputs the first offset voltage.

In an embodiment of the present invention, the DAC generates a second divided voltage by dividing the voltage difference between the first input voltage and the second input voltage based on a second code, and the offset voltage generator further includes a second voltage divider. The voltage divider is coupled to the DAC and divides the second divided voltage to generate a second offset voltage.

In an embodiment of the present invention, the second voltage divider includes a first resistor and a second resistor, wherein the first resistor and the second resistor are connected in series. A first end of the first resistor is applied with the second divided voltage, and a second end of the first resistor is coupled to the second resistor and outputs the second offset voltage.

In an embodiment of the present invention, the second voltage divider includes a first resistor, a second resistor, and an operational amplifier. The first resistor and the second resistor are connected in series. A first end of the first resistor is applied with the second divided voltage, and a second end of the first resistor is coupled to the second resistor and a positive input terminal of the operational amplifier. An output terminal of the operational amplifier is coupled to a negative input terminal of the operational amplifier and outputs the second offset voltage.

In an embodiment of the present invention, the offset voltage generator divides the voltage difference between the first input voltage and the second input voltage based on a second code so as to generate a second offset voltage, and the voltage level shifter further includes a third voltage shifting circuit and a fourth voltage shifting circuit. The third voltage shifting circuit is coupled to the offset voltage generator, and shifts down the first reference voltage by the second offset voltage to output a third level-shifted voltage. The fourth voltage shifting circuit is coupled to the offset voltage generator, and shifts down the second reference voltage by the second offset voltage to output a fourth level-shifted voltage.

In an embodiment of the present invention, the voltage level shifter includes a first switch and a second switch. The first switch selects and outputs one of the first level-shifted voltage and the third level-shifted voltage to the first end of the resistor string according to a timing signal. The second switch selects and outputs one of the second level-shifted voltage and the fourth level-shifted voltage to the second end of the resistor string according to the timing signal.

In an embodiment of the present invention, the first switch is controlled by the timing signal to interleavedly output the first level-shifted voltage and the third level-shifted voltage. The second switch is controlled by the timing signal to interleavedly output the second level-shifted voltage and the fourth level-shifted voltage.

In an embodiment of the present invention, each of the third voltage shifting circuit and the fourth voltage shifting circuit includes an operational amplifier. A positive input terminal of the operational amplifier of the third voltage shifting circuit is coupled to the first reference voltage, a negative input terminal of the operational amplifier of the third voltage shifting circuit is coupled to the second offset voltage, and an output terminal of the operational amplifier of the third voltage shifting circuit is coupled to the negative input terminal of the operational amplifier of the third voltage shifting circuit and outputs the third level-shifted voltage. A positive input terminal of the operational amplifier of the fourth voltage shifting circuit is coupled to the second reference voltage, a negative input terminal of the operational amplifier of the fourth voltage shifting circuit s coupled to the second offset voltage, and an output terminal of the operational amplifier of the fourth voltage shifting circuit is coupled to the negative input terminal of the operational amplifier of the fourth voltage shifting circuit and outputs the fourth level-shifted voltage.

In an embodiment of the present invention, each of the first voltage shifting circuit and the second voltage shifting circuit comprises an operational amplifier. A positive input terminal of the operational amplifier of the first voltage shifting circuit is coupled to the first reference voltage, a negative input terminal of the operational amplifier of the first voltage shifting circuit is coupled to the first offset voltage, and an output terminal of the operational amplifier of the first voltage shifting circuit is coupled to the negative input terminal of the operational amplifier of the first voltage shifting circuit and outputs the first level-shifted voltage. A positive input terminal of the operational amplifier of the second voltage shifting circuit is coupled to the second reference voltage, a negative input terminal of the operational amplifier of the second voltage shifting circuit is coupled to the first offset voltage, and an output terminal of the operational amplifier of the second voltage shifting circuit is coupled to the negative input terminal of the operational amplifier of the second voltage shifting circuit and outputs the second level-shifted voltage.

In an embodiment of the present invention, the gamma voltage generation circuit further includes a DAC coupled to the resistors of the resistor string, wherein the DAC outputs one of the gamma voltages according to a data code.

In an embodiment of the present invention, the first offset voltage is a positive voltage.

In an embodiment of the present invention, the first offset voltage is a negative voltage.

According to the above descriptions, the gamma generation circuit of the present invention can generate an offset voltage according to the first code, and shifts the levels of the gamma voltages according to the offset voltage. Moreover, the gamma generation circuit can generate another offset voltage according to the second code, and shifts the levels of the gamma voltages according to the other offset voltage. Therefore, according to the shifted gamma voltages, the pixels with different common voltage levels may have a similar or a same display effect.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

First Embodiment

Figure 1:
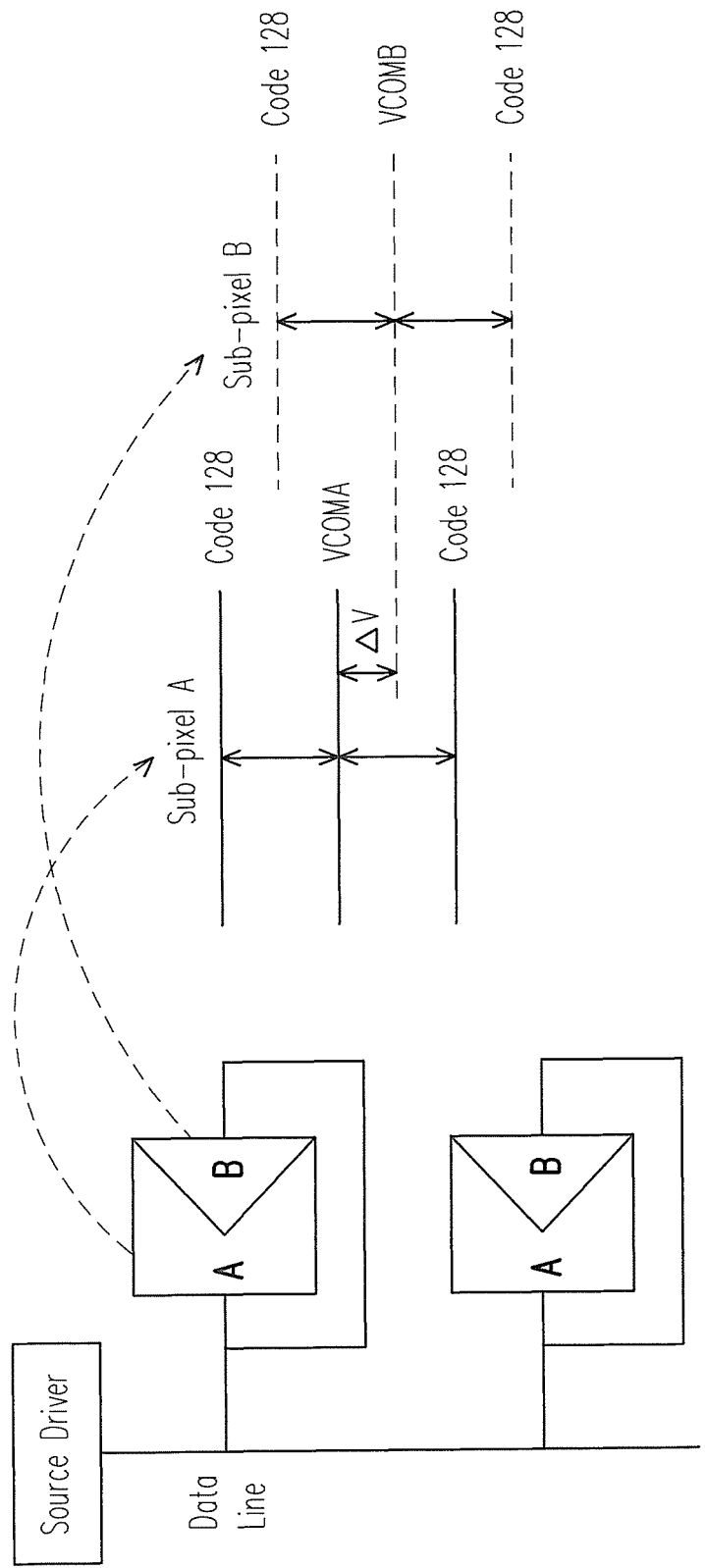
FIG. 1 illustrates a pixel having two sub-pixels biased by different common voltage levels.
Figure 2:
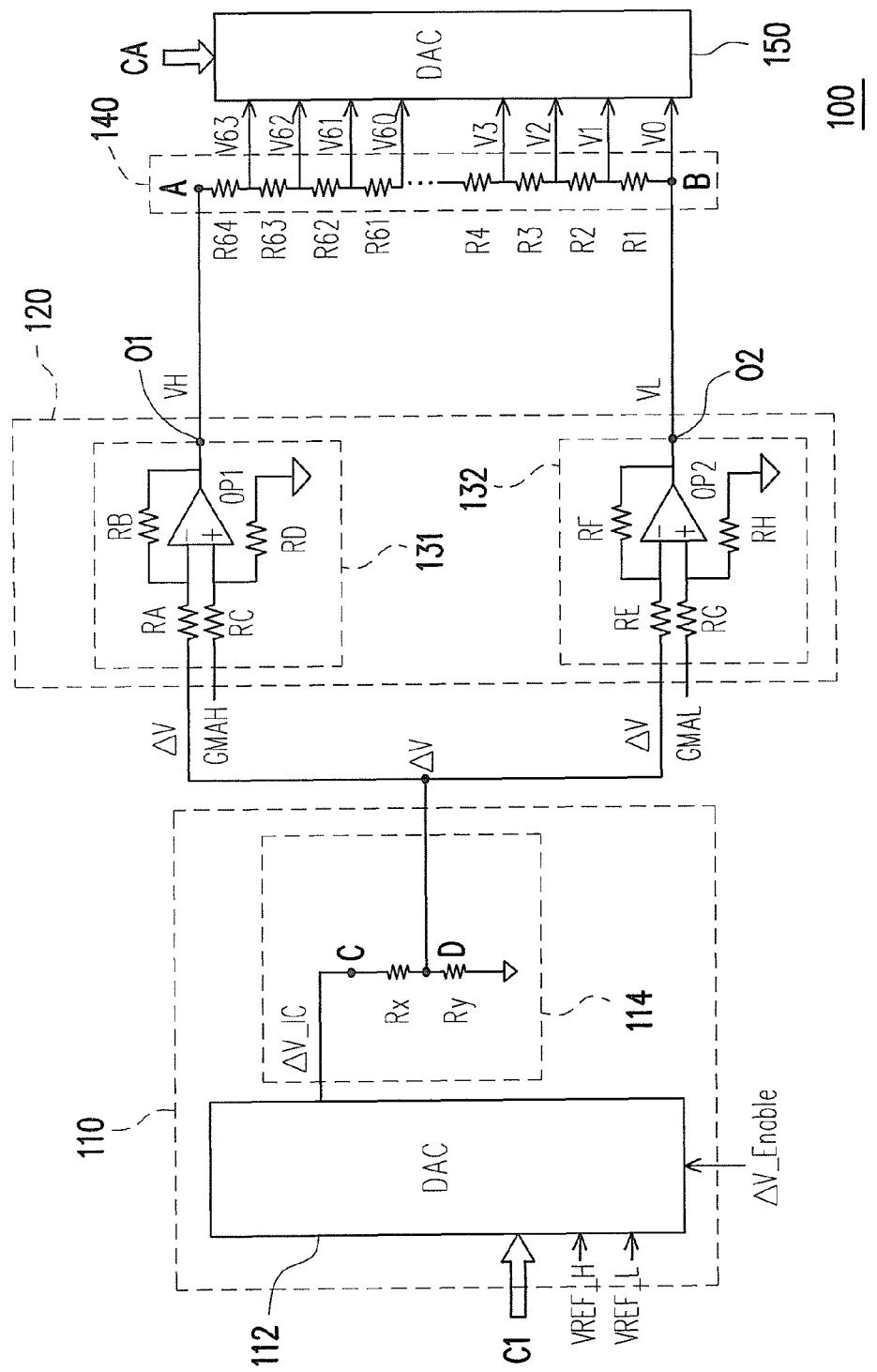
FIG. 2 is a circuit diagram illustrating a gamma voltage generation circuit according to a first embodiment of the present invention.

FIG. 2 is a circuit diagram illustrating a gamma voltage generation circuit according to a first embodiment of the present invention. Referring to FIG. 2, the gamma voltage generation circuit 100 includes an offset voltage generator 110, a voltage level shifter 120, a resistor string 140, and a digital-to-analog converter (DAC) 150. The offset voltage generator 110 includes a DAC 112 and a first voltage divider 114. After the DAC 112 receives an enable signal $\Delta V\_Enable$, the DAC 112 generates a first divided voltage $\Delta V\_IC$ by dividing a voltage difference between a first input voltage VREF_H and a second input voltage VREF_L according to a first code C1.

Further, assuming the first code C1 is 10 bits, i.e. the DAC 112 is 10 bits, the DAC 112 then divides the voltage difference between the first input voltage VREF_H and the second input voltage VREF_L into 1024 (i.e. 10 power of 2) equal parts, and outputs a corresponding voltage level according to the first code C1. It should be noticed that the higher the bit number of the DAC 112 is (for example, 12 bits), the more equal parts the voltage difference between the first input voltage VREF_H and the second input voltage VREF_L is divided (for example, 4096 equal parts, i.e. 12 power of 2 equal parts). Conversely, the lower the bit number of the DAC 112 is (for example, 8 bits), the lesser equal parts the voltage difference between the first input voltage VREF_H and the second input voltage VREF_L is divided (for example, 256 equal parts, i.e. 8 power of 2 equal parts).

The first voltage divider 114 includes resistors Rx and Ry, wherein the resistor Rx and the resistor Ry are connected in series. A first end C of the resistor Rx is coupled to the DAC 112 and is applied with the first divided voltage ΔV_IC, and a second end D of the resistor Rx is coupled to the resistor Ry and outputs a first offset voltage ΔV to the voltage level shifter 120, so that the voltage divider 114 can divide the first divided voltage ΔV_IC to generate the first offset voltage ΔV. A relationship among the first divided voltage ΔV_IC, the resistors Rx and Ry can be represented by a following equation:

$$\Delta V = \Delta V\_IC \times \frac{Ry}{Rx+Ry}$$

Where, Ry/(Rx+Ry) can be regarded as a voltage-dividing ratio of the voltage divider 114. Therefore, the offset voltage generator 110 can generate the first offset voltage ΔV by dividing the voltage difference between the first input voltage VREF_H and the second input voltage VREF_L based on the first code C1.

It should be noticed that the DAC 112 could be implemented by a DAC with a low bit number as considering the cost thereof, so that the first divided voltage ΔV_IC may be not in accordance with the ideal first offset voltage ΔV, and thus, the ideal first offset voltage ΔV can be obtained based on the voltage-dividing ratio of the voltage divider 114. For example, if the ideal first offset voltage ΔV is 1/100 of the first divided voltage ΔV_IC, a resistance ratio between the resistors Rx and Ry can be designed to 99:1, i.e. the voltage-dividing ratio of the voltage divider 114 is designed to be 1/100. According to the above description, the voltage difference between the first input voltage VREF_H and the second input voltage VREF_L is first divided by the DAC 112 (a first voltage-dividing), and further divided by the voltage divider 114 (a second voltage-dividing), so that the voltage difference between the first input voltage VREF_H and the second input voltage VREF_L can be finely divided to obtain the ideal first offset voltage ΔV.

In an embodiment of the present invention, the DAC 112, the resistor string 140 and the DAC 150 is embedded in a source driver, and the voltage divider 114 and the voltage level shifter 120 is placed on a flexible printed board outside the source driver. Therefore, in case of the long transmission path of the first divided voltage ΔV_IC, the first divided voltage ΔV_IC could be shifted due to the influence of noise. To reduce the influence of noise during transmission of the first divided voltage ΔV_IC, the first divided voltage ΔV_IC can be designed to be higher than a voltage of the noise. Therefore, after the voltage-dividing operation of the voltage divider 114, the first divided voltage ΔV_IC is divided to obtain the first offset voltage ΔV, and the noise can be reduced or eliminated due to the voltage-dividing operation.

The voltage level shifter 120 includes a first voltage shifting circuit 131 and a second voltage shifting circuit 132. The first voltage shifting circuit 131 includes an operational amplifier OP1 and resistors RA, RB, RC and RD, wherein resistances of the resistors RA, RB, RC and RD are the same. A positive input terminal of the operational amplifier OP1 is coupled to a first reference voltage GMAH via the resistor RC, and is coupled to a ground voltage via the resistor RD, a negative input terminal of the operational amplifier OP1 is coupled to the first offset voltage ΔV via the resistor RA, and an output terminal of the operational amplifier OP1 is coupled to the negative input terminal of the operational amplifier OP1 via the resistor RB, and outputs a first level-shifted voltage VH. The first level-shifted voltage VH output by the first voltage shifting circuit 131 is equal to the first reference voltage GMAH minus the first offset voltage ΔV, i.e. the first level-shifted voltage VH is equal to the first reference voltage GMAH shifted down by the first offset voltage ΔV.

The second voltage shifting circuit 132 includes an operational amplifier OP2 and resistors RE, RF, RG and RH, wherein resistances of the resistors RE, RF, RG and RH are the same. A positive input terminal of the operational amplifier OP2 is coupled to a second reference voltage GMAL via the resistor RG, and is coupled to the ground voltage via the resistor RH, a negative input terminal of the operational amplifier OP2 is coupled to the first offset voltage ΔV via the resistor RE, and an output terminal of the operational amplifier OP2 is coupled to the negative input terminal of the operational amplifier OP2 via the resistor RF, and outputs a second level-shifted voltage VL. The second level-shifted voltage VL output by the second voltage shifting circuit 132 is equal to the second reference voltage GMAL minus the first offset voltage ΔV, i.e. the second level-shifted voltage VL is equal to the second reference voltage GMAL shifted down by the first offset voltage ΔV.

The voltage level shifter 120 takes the output terminal of the operational amplifier OP1 as a first output terminal O1 to output the first level-shifted voltage VH to a first end A of the resistor string 140, and the voltage level shifter 120 takes the output terminal of the operational amplifier OP2 as a second output terminal O2 to output the second level-shifted voltage VL to a second end B of the resistor string 140. The resistor string 140 includes a plurality of resistors R1-R64 connected in series, and the resistors R1-R64 can divide the voltage difference between the first level-shifted voltage VH and the second level-shifted voltage VL to output a plurality of divided voltages, wherein the divided voltages severe as gamma voltages V0-V63. The DAC 150 is coupled to the resistors R1-R64 of the resistor string 140, and outputs one of the gamma voltages V0-V63 provided by the resistors R1-R64 to serve as a driving voltage according to a data code CA, so as to drive liquid crystal to display a brightness of a corresponding gray level. By such means, when common voltage levels of two pixels (or sub pixels) are different, a level of each of the gamma voltages can be shifted according to the first offset voltage ΔV, so that the two sub pixels can display similar or the same brightness in case of the same gray level.

Moreover, since the first level-shifted voltage VH and the second level-shifted voltage VL is generated based on the first offset voltage ΔV, and the first offset voltage ΔV is generated according to the first code C1, a plurality of gamma curves for providing the gamma voltages V0-V63 could be generated based on the first code C1. In addition, when the level of the common voltages of different pixels (or sub-pixel) is different, the reference voltages of different levels can be outputted to tune the level of respective gamma voltages according to the first code C1 so as to make the illumination of different pixels close or even the same for the same grey level. The phenomenon of color shift of the LCD panel would be avoided by applying proper gamma voltages to the sub-pixels of the LCD panel. For example, in an LCD panel that one pixel thereof has two sub-pixels applied by different common voltages, when driving the two sub-pixels of the same pixel, one of the sub-pixels may be driven by using one of the plurality of gamma curves, and the other sub-pixel may be driven by using another one of the plurality of gamma curves, such that the phenomenon of color shift of the LCD panel would be avoided. Moreover, the phenomenon of crosstalk of the display could be avoided by shifting the gamma voltages by the proper offset voltages within corresponding scanning periods of the display.

It should be noticed that since a level shifting reference point of the gamma voltage can be a higher common voltage or a lower common voltage of the two pixels, the first offset voltage ΔV can be a negative voltage or a positive voltage. Moreover, the gamma voltage generation circuit of 6 bits (i.e. the number of the resistors in the resistor string 140 is 6 power of 2) is illustrated in FIG. 2, and if a gamma voltage generation circuit of 8 bits is used, the number of the resistors connected in series in the resistor string 140 is increased to 256 (i.e. 8 power of 2). The gamma voltage generation circuits with other bit numbers (for example, 10 bits) can be deduced by analogy.

Second Embodiment

Figure 3:
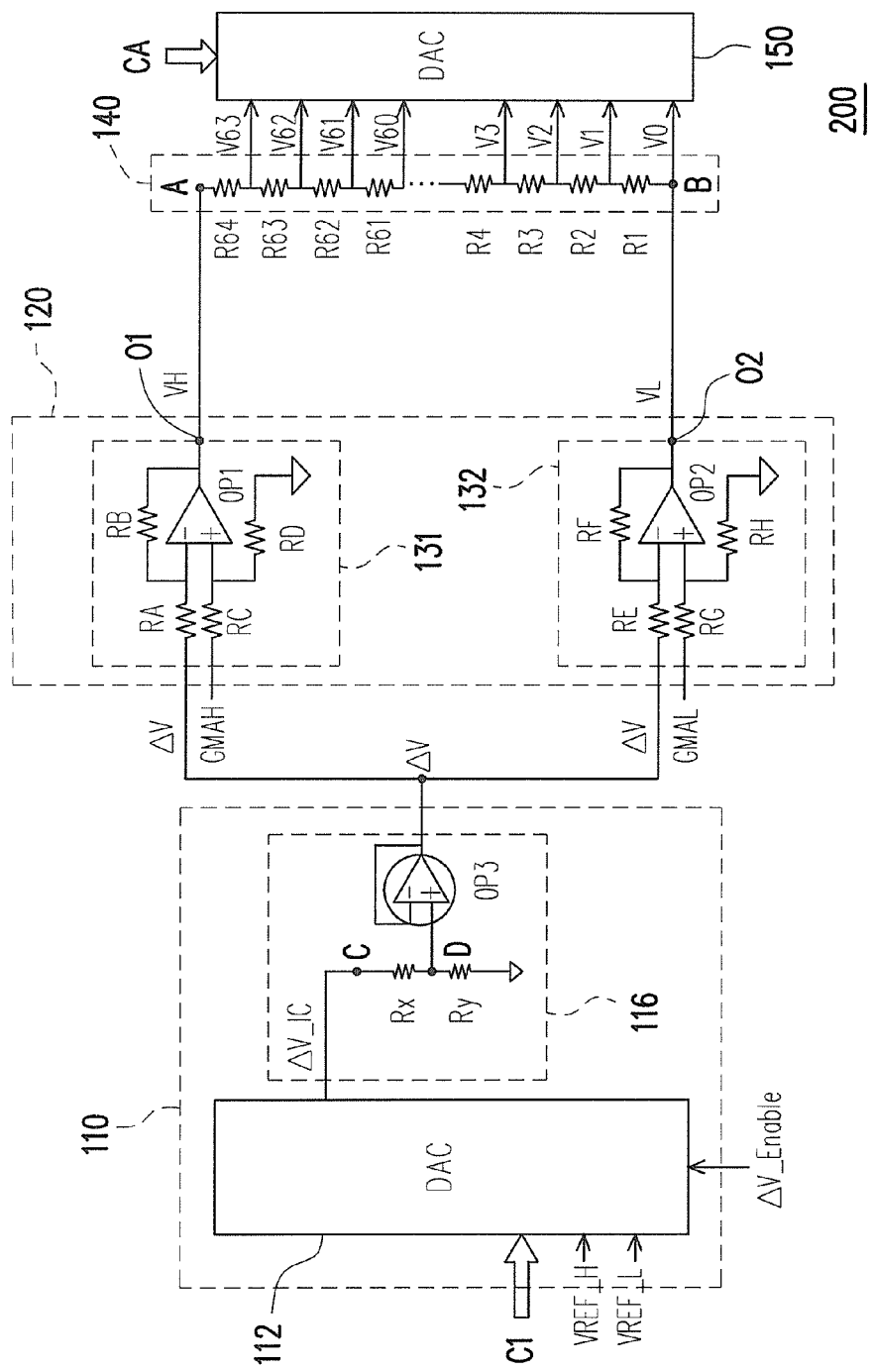
FIG. 3 is a circuit diagram illustrating a gamma voltage generation circuit according to a second embodiment of the present invention.

FIG. 3 is a circuit diagram illustrating a gamma voltage generation circuit according to a second embodiment of the present invention. Referring to FIG. 2 and FIG. 3, a difference there between is that a first voltage divider 116 of the gamma voltage generation circuit 200 further includes an operational amplifier OP3. A positive input terminal of the operational amplifier OP3 is coupled to the second end of the resistor Rx, and an output terminal of the operational amplifier OP3 is coupled to a negative terminal thereof, and outputs the first offset voltage ΔV. Wherein, the operational amplifier OP3 can be regarded as a voltage follower, and after the resistors Rx and Ry divide the first divided voltage ΔV_IC, the divided voltage is output to serve as the first offset voltage ΔV. By such means, a load effect between the offset voltage generator 110 and the voltage level shifter 120 is reduced.

Third Embodiment

Figure 4:
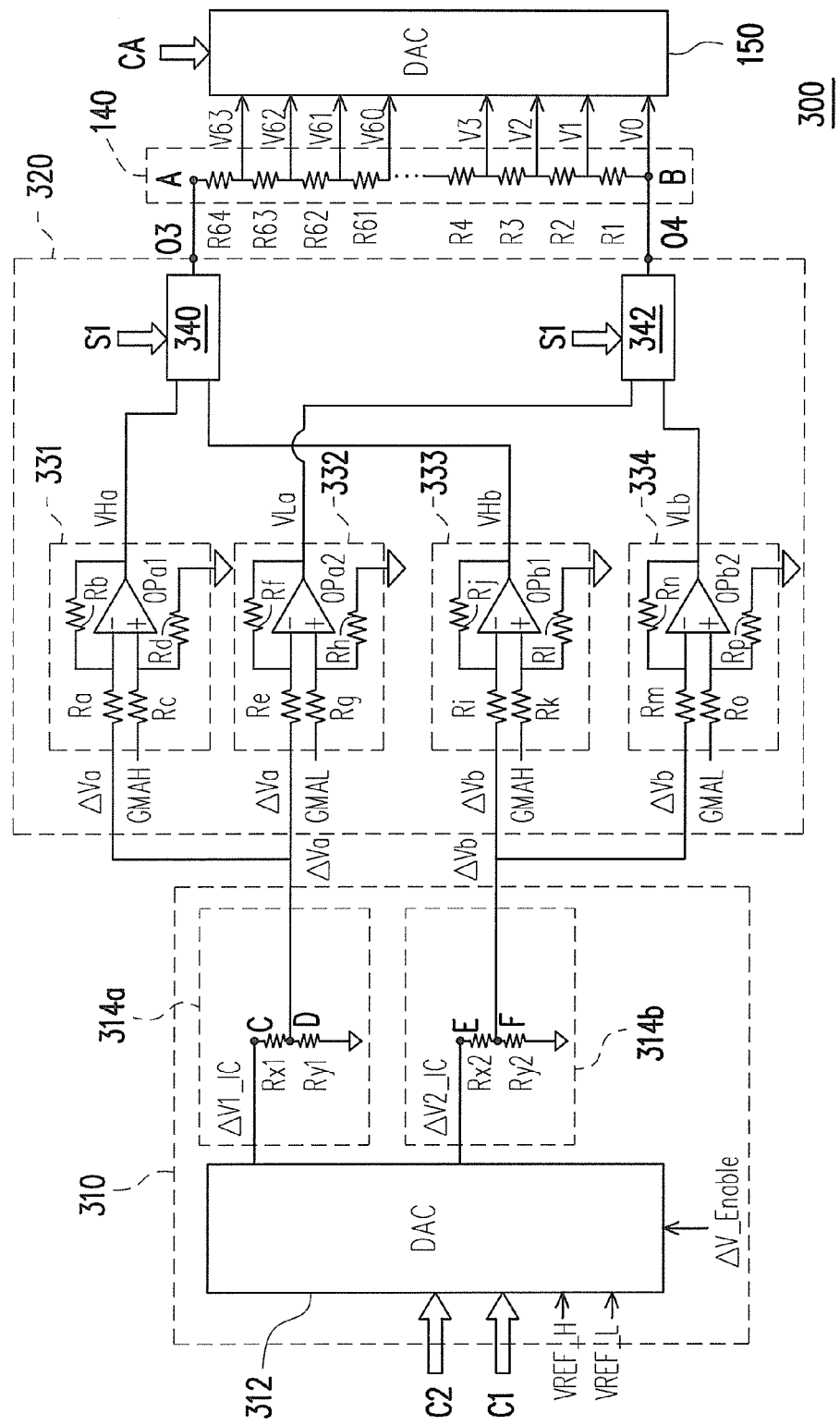
FIG. 4 is a circuit diagram illustrating a gamma voltage generation circuit according to a third embodiment of the present invention.

FIG. 4 is a circuit diagram illustrating a gamma voltage generation circuit according to a third embodiment of the present invention. Referring to FIG. 2 and FIG. 4, a difference there between lies in an offset voltage generator 310 and a voltage level shifter 320 of the gamma voltage generation circuit 300. The offset voltage generator 310 includes a DAC 312, a first voltage divider 314a and a second voltage divider 314b. After the DAC 312 receives the enable signal ΔV_Enable, the DAC 312 generates a first divided voltage ΔV1_IC by dividing the voltage difference between the first input voltage VREF_H and the second input voltage VREF_L according to the first code C1, and generates a second divided voltage ΔV2_IC by dividing the voltage difference between the first input voltage VREF_H and the second input voltage VREF_L according to a second code C2.

The voltage dividers 314a and 314b are coupled to the DAC 312. The voltage divider 314a divides the first divided voltage ΔV1_IC to generate a first offset voltage ΔVa, and the voltage divider 314b divides the second divided voltage ΔV2_IC to generate a second offset voltage ΔVb. The voltage divider 314a includes resistors Rx1 and Ry1, wherein a first end C of the resistor Rx1 is applied with the first divided voltage ΔV1_IC, and a second end D of the resistor Rx1 outputs the first offset voltage ΔVa. The voltage divider 314b includes resistors Rx2 and Ry2, wherein a first end E of the resistor Rx2 is applied with the second divided voltage ΔV2_IC, and a second end F of the resistor Rx2 outputs the second offset voltage ΔVb. Wherein, circuit structures and operations of the voltage dividers 314a and 314b are similar to those of the voltage divider 114, and therefore detailed descriptions thereof are not repeated.

The voltage level shifter 320 includes a first voltage shifting circuit 331, a second voltage shifting circuit 332, a third voltage shifting circuit 333, a fourth voltage shifting circuit 334, a first switch 340, and a second switch 342. The first voltage shifting circuit 331 is coupled to the offset voltage generator 310 for shifting down the first reference voltage GMAH by the first offset voltage ΔVa to output a first level-shifted voltage VHa. The second voltage shifting circuit 332 is also coupled to the offset voltage generator 310 for shifting down the second reference voltage GMAL by the first offset voltage ΔVa to output a second level-shifted voltage VLa. The third voltage shifting circuit 333 is coupled to the offset voltage generator 310 for shifting down the first reference voltage GMAH by the second offset voltage ΔVb to output a third level-shifted voltage VHb. The fourth voltage shifting circuit 334 is coupled to the offset voltage generator 310 for shifting down the second reference voltage GMAL by the second offset voltage ΔVb to output a fourth level-shifted voltage VLb.

Figure 5:
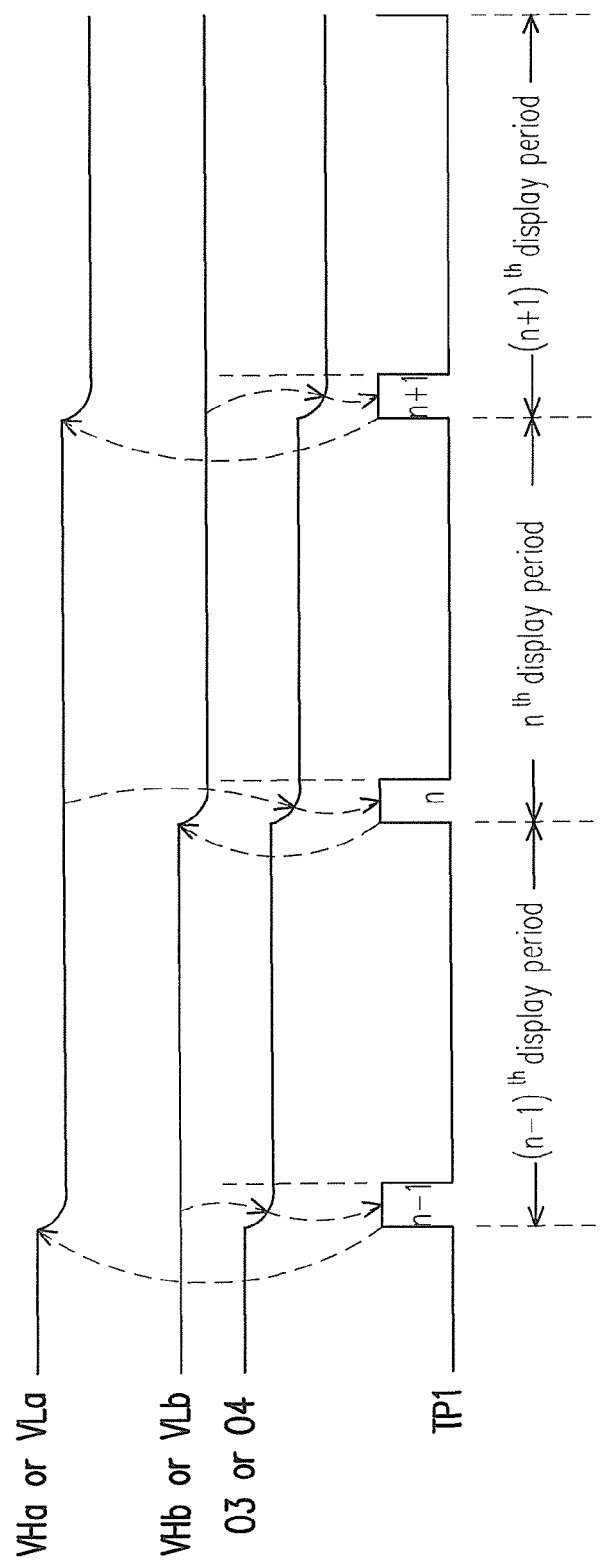
FIG. 5 is a timing diagram of signals of the gamma voltage generation circuit in FIG. 4.

The first switch 340 selects and outputs the first level-shifted voltage VHa or the third level-shifted voltage VHb to the first end A of the resistor string 140 according to a timing signal S1, and an output terminal of the first switch 340 serves as an output terminal O3 of the voltage level shifter 320. The second switch 342 selects and outputs the second level-shifted voltage VLa or the fourth level-shifted voltage VLb to the second end B of the resistor string 140 according to the timing signal S1, and an output terminal of the second switch 342 serves as an output terminal O4 of the voltage level shifter 320. Further, the first switch 340 is controlled by the timing signal S1 to interleavedly output the first level-shifted voltage VHa and the third level-shifted voltage VHb to the first end A of the resistor string 140, and the second switch 342 is controlled by the timing signal S1 to interleavedly output the second level-shifted voltage VLa and the fourth level-shifted voltage VLb to the second end B of the resistor string 140. In an embodiment, the gamma voltage generation circuit 300 is used in a LCD, which operates at a frame rate of 120 hertz. As compared to a LCD operating at a frame rate of 60 hertz, the LCD operating at a frame rate of 120 hertz has a shorter display period for scanning the scan lines of the LCD. Since the display period of the LCD operating at the frame rate of 120 hertz may be too short, the voltage shifting circuits 331-334 may not output the level-shifted voltage VHa, VHb, VLa and VLb at desired voltage levels within a single display period. Therefore, the first switch 340 and the second switch 342 interleavedly output corresponding level-shifted voltages to the first end A and the second end B to shift the gamma voltages V0-V63 at desired voltage levels. Please refer to FIG. 5. FIG. 5 is a timing diagram of signals of the gamma voltage generation circuit 300. The parameter n is a positive odd integer, such that the $n^{th}$ display period is one of the odd display period of the LCD panel driven by the gamma voltage generation circuit 300 and that each of the $(n-1)^{th}$ and the $(n+1)^{th}$ display periods is one of the even display period of the LCD panel. The voltage shifting circuits 331-334 operate under the control of the signal TP1. In detail, within even display periods and when the signal TP1 is high, the first voltage shifting circuit 331 and the second voltage shifting circuit 332 settle the first level-shifted voltage VHa and the second level-shifted voltage VLa, and the third voltage shifting circuit 333 and the fourth voltage shifting circuit 334 output the third level-shifted voltage VHb and the fourth level-shifted voltage VLb through the switches 340 and 342 to the resistor string 140. Within odd display periods and when the signal TP1 is high, the first voltage shifting circuit 331 and the second voltage shifting circuit 332 output the first level-shifted voltage VHa and the second level-shifted voltage VLa through the switches 340 and 342 to the resistor string 140, and the third voltage shifting circuit 333 and the fourth voltage shifting circuit 334 settle the third level-shifted voltage VHb and the fourth level-shifted voltage VLb. Therefore, the gamma voltages V0-V63 would be shifted at desired voltage levels even if the display period is short.

The first voltage shifting circuit 331 includes an operational amplifier OPa1 and resistors Ra, Rb, Rc, and Rd. The second voltage shifting circuit 332 includes an operational amplifier OPa2 and resistors Re, Rf, Rg, and Rh. The third voltage shifting circuit 333 includes an operational amplifier OPb1 and resistors Ri, Rj, Rk, and R1. The fourth voltage shifting circuit 334 includes an operational amplifier Opb2 and resistors Rm, Rn, Ro, and Rp. Wherein, circuit structures and operations of the first voltage shifting circuit 331, the second voltage shifting circuit 332, the third voltage shifting circuit 333 and the fourth voltage shifting circuit 334 are similar to that of the first voltage shifting circuit 131 or the second voltage shifting circuit 132, and therefore detailed descriptions thereof are not repeated.

Because the first offset voltage ΔVa is generated according to the first code C1, and the second offset voltage ΔVb is generated according to the second code C2, a plurality of gamma curves for providing the gamma voltages V0-V63 could be generated based on the first code C1 and the second code C2. When the level of the common voltages of different pixels (or sub-pixel) is different, the reference voltages of different levels can be outputted to tune the level of respective gamma voltages according to the first code C1 so as to make the illumination of different pixels close or even the same for the same grey level. The phenomenon of color shift of the LCD panel would be avoided by applying proper gamma voltages to the sub-pixels of the LCD panel. For example, in an LCD panel that one pixel thereof has two sub-pixels applied by different common voltages, when driving the two sub-pixels of the same pixel, one of the sub-pixels may be driven by using one of the plurality of gamma curves, and the other sub-pixel may be driven by using another one of the plurality of gamma curves, such that the phenomenon of color shift of the LCD panel would be avoided. Moreover, the phenomenon of crosstalk of the display could be avoided by shifting the gamma voltages by the proper offset voltages within corresponding scanning periods of the display.

Fourth Embodiment

Figure 6:
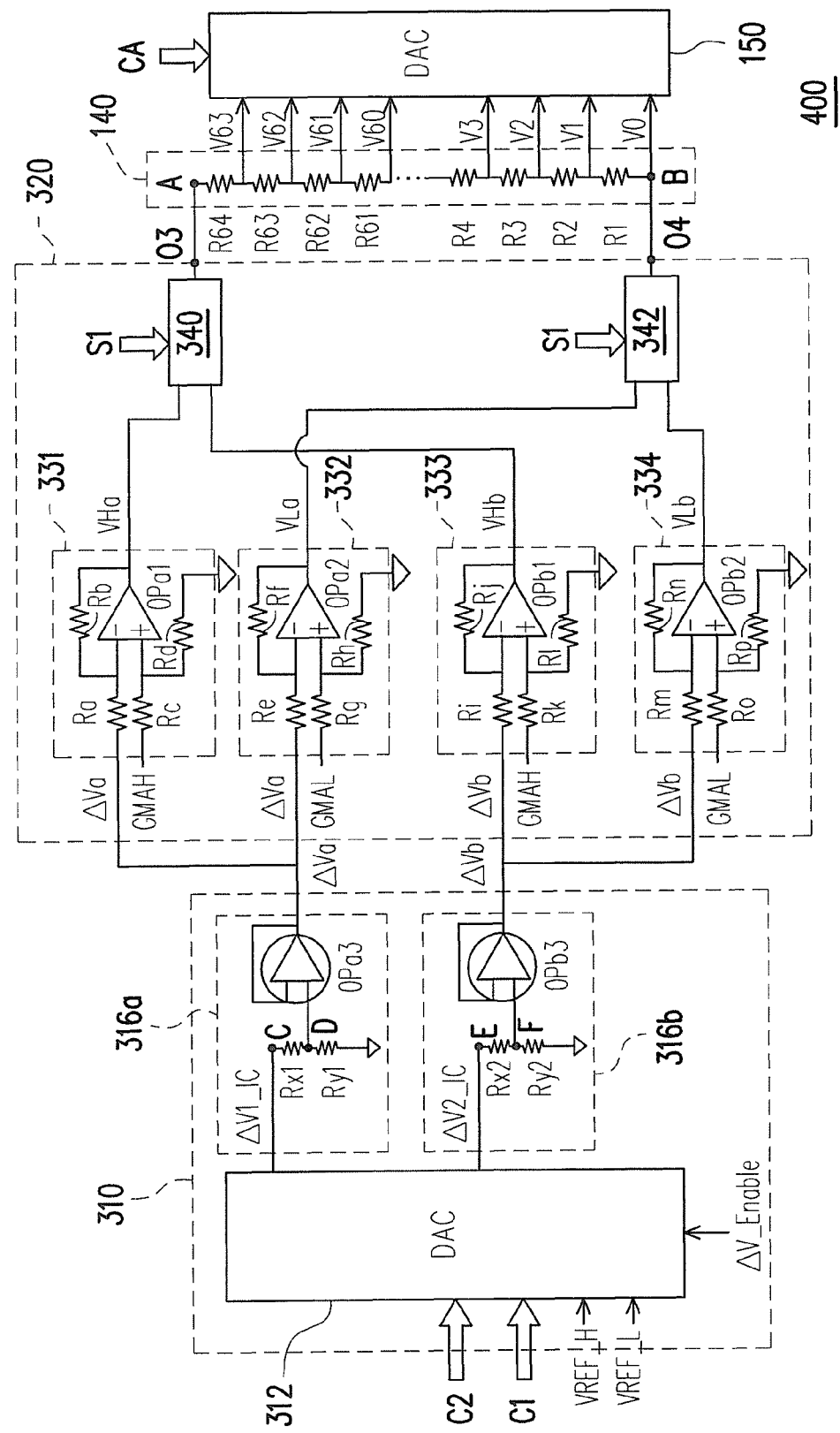
FIG. 6 is a circuit diagram illustrating a gamma voltage generation circuit according to a fourth embodiment of the present invention.

FIG. 6 is a circuit diagram illustrating a gamma voltage generation circuit according to a fourth embodiment of the present invention. Referring to FIG. 4 and FIG. 6, a difference there between is that a first voltage divider 316a of the gamma voltage generation circuit 400 further includes an operational amplifier OPa3, and a second voltage divider 316b of the gamma voltage generation circuit 400 further includes an operational amplifier OPb3. The operational amplifier OPa3 can be regarded as a voltage follower, and after the resistors Rx1 and Ry1 divide the first divided voltage ΔV1_IC, the divided voltage is output to serve as the first offset voltage ΔVa. Similarly, the operational amplifier OPb3 can be regarded as a voltage follower, and after the resistors Rx2 and Ry2 divide the second divided voltage ΔV2_IC, the divided voltage is output to serve as the second offset voltage ΔVb. By such means, a load effect between the offset voltage generator 310 and the voltage level shifter 320 is reduced.

In summary, the gamma generation circuit of the present invention can generate an offset voltage according to the first code, and shifts the levels of the gamma voltages according to the offset voltage. Moreover, the gamma generation circuit can generate another offset voltage according to the second code, and shifts the levels of the gamma voltages according to the other offset voltage. Therefore, according to the shifted gamma voltages, the pixels with different common voltage levels may have a similar or a same display effect. Moreover, the voltage follower is added to the offset voltage generator, so as to reduce the load effect between the offset voltage generator and the voltage level shifter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gamma voltage generation circuit, configured to generate a plurality of gamma voltages, the gamma voltage generation circuit comprising:
   an offset voltage generator, generating a first offset voltage by dividing a voltage difference between a first input voltage and a second input voltage based on a first code;
   a voltage level shifter, coupled to the offset voltage generator and comprising:
   a first voltage shifting circuit, coupled to the offset voltage generator, shifting down a first reference voltage by the first offset voltage to output a first level-shifted voltage; and
   a second voltage shifting circuit, coupled to the offset voltage generator, shifting down a second reference voltage by the first offset voltage to output a second level-shifted voltage; and
   a resistor string, comprising a plurality of resistors connected in series, each of the resistors outputting one of the gamma voltages, wherein a first end of the resistor string is coupled to an output terminal of the voltage level shifter, and a second end of the resistor string is coupled to an output terminal of the voltage level shifter;
   wherein the offset voltage generator comprises:
   a digital-to-analog converter, generating a first divided voltage by dividing the voltage difference between the first input voltage and the second input voltage according to the first code; and
   a first voltage divider, coupled to the digital-to-analog converter, dividing the first divided voltage to generate the first offset voltage.

2. The gamma voltage generation circuit as claimed in claim 1, wherein a voltage level of the output terminal of the voltage level shifter is equal to the first level-shifted voltage, and a voltage level of the output terminal of the voltage level shifter is equal to the second level-shifted voltage.

3. The gamma voltage generation circuit as claimed in claim 1, wherein the first voltage divider comprises a first resistor and a second resistor, the first resistor and the second resistor are connected in series, a first end of the first resistor is applied with the first divided voltage, and a second end of the first resistor is coupled to the second resistor and outputs the first offset voltage.

4. The gamma voltage generation circuit as claimed in claim 1, wherein the first voltage divider comprises a first resistor, a second resistor, and an operational amplifier, the first resistor and the second resistor are connected in series, a first end of the first resistor is applied with the first divided voltage, a second end of the first resistor is coupled to the second resistor and a positive input terminal of the operational amplifier, and an output terminal of the operational amplifier is coupled to a negative input terminal of the operational amplifier and outputs the first offset voltage.

5. The gamma voltage generation circuit as claimed in claim 1, wherein the digital-to-analog converter further generates a second divided voltage by dividing the voltage difference between the first input voltage and the second input voltage based on a second code, and the offset voltage generator further comprises a second voltage divider, the voltage divider is coupled to the digital-to-analog converter and divides the second divided voltage to generate a second offset voltage.

6. The gamma voltage generation circuit as claimed in claim 5, wherein the second voltage divider comprises a first resistor and a second resistor, the first resistor and the second resistor are connected in series, a first end of the first resistor is applied with the second divided voltage, and a second end of the first resistor is coupled to the second resistor and outputs the second offset voltage.

7. The gamma voltage generation circuit as claimed in claim 5, wherein the second voltage divider comprises a first resistor, a second resistor, and an operational amplifier, the first resistor and the second resistor are connected in series, a first end of the first resistor is applied with the second divided voltage, a second end of the first resistor is coupled to the second resistor and a positive input terminal of the operational amplifier, and an output terminal of the operational amplifier is coupled to a negative input terminal of the operational amplifier and outputs the second offset voltage.

8. The gamma voltage generation circuit as claimed in claim 1, wherein the offset voltage generator divides the voltage difference between the first input voltage and the second input voltage based on a second code so as to generate a second offset voltage, and the voltage level shifter further comprises:
- a third voltage shifting circuit, coupled to the offset voltage generator, shifting down the first reference voltage by the second offset voltage to output a third level-shifted voltage; and
- a fourth voltage shifting circuit, coupled to the offset voltage generator, shifting down the second reference voltage by the second offset voltage to output a fourth level-shifted voltage.

9. The gamma voltage generation circuit as claimed in claim 8, wherein the voltage level shifter comprises a first switch and a second switch, the first switch selects and outputs one of the first level-shifted voltage and the third level-shifted voltage to the first end of the resistor string according to a timing signal, and second switch selects and outputs one of the second level-shifted voltage and the fourth level-shifted voltage to the second end of the resistor string according to the timing signal.

10. The gamma voltage generation circuit as claimed in claim 9, wherein the first switch is controlled by the timing signal to interleavedly output the first level-shifted voltage and the third level-shifted voltage, and the second switch is controlled by the timing signal to interleavedly output the second level-shifted voltage and the fourth level-shifted voltage.

11. The gamma voltage generation circuit as claimed in claim 8, wherein each of the third voltage shifting circuit and fourth voltage shifting circuit comprises an operational amplifier,
- wherein a positive input terminal of the operational amplifier of the third voltage shifting circuit is coupled to the first reference voltage, a negative input terminal of the operational amplifier of the third voltage shifting circuit is coupled to the second offset voltage, and an output terminal of the operational amplifier of the third voltage shifting circuit is coupled to the negative input terminal of the operational amplifier of the third voltage shifting circuit and outputs the third level-shifted voltage,
- wherein a positive input terminal of the operational amplifier of the fourth voltage shifting circuit is coupled to the second reference voltage, a negative input terminal of the operational amplifier of the fourth voltage shifting circuit is coupled to the second offset voltage, and an output terminal of the operational amplifier of the fourth voltage shifting circuit is coupled to the negative input terminal of the operational amplifier of the fourth voltage shifting circuit and outputs the fourth level-shifted voltage.

12. The gamma voltage generation circuit as claimed in claim 1, wherein each of the first voltage shifting circuit and the second voltage shifting circuit comprises an operational amplifier,
- wherein a positive input terminal of the operational amplifier of the first voltage shifting circuit is coupled to the first reference voltage, a negative input terminal of the operational amplifier of the first voltage shifting circuit is coupled to the first offset voltage, and an output terminal of the operational amplifier of the first voltage shifting circuit is coupled to the negative input terminal of the operational amplifier of the first voltage shifting circuit and outputs the first level-shifted voltage,
- wherein a positive input terminal of the operational amplifier of the second voltage shifting circuit is coupled to the second reference voltage, a negative input terminal of the operational amplifier of the second voltage shifting circuit is coupled to the first offset voltage, and an output terminal of the operational amplifier of the second voltage shifting circuit is coupled to the negative input terminal of the operational amplifier of the second voltage shifting circuit and outputs the second level-shifted voltage.

13. The gamma voltage generation circuit as claimed in claim 1, further comprising a digital-to-analog converter, coupled to the resistors of the resistor string, wherein the digital-to-analog converter outputs one of the gamma voltages according to a data code.

14. The gamma voltage generation circuit as claimed in claim 1, wherein the first offset voltage is a positive voltage.

15. The gamma voltage generation circuit as claimed in claim 1, wherein the first offset voltage is a negative voltage.

* * * * *